FOUR LAYER SEMICONDUCTOR DEVICES WITH IMPROVED HIGH VOLTAGE CHARACTERISTICS

Filed Aug. 10, 1964

3,341,749

FOUR LAYER SEMICONDUCTOR DEVICES WITH IMPROVED HIGH VOLTAGE CHARACTERISTICS

John Shields and Albert John Sadler, Rugby, England, assignors to Associated Electrical Industries Limited, London, England, a British company Filed Aug. 10, 1964, Ser. No. 388,357
1 Claim. (Cl. 317—234)

Figure 1:
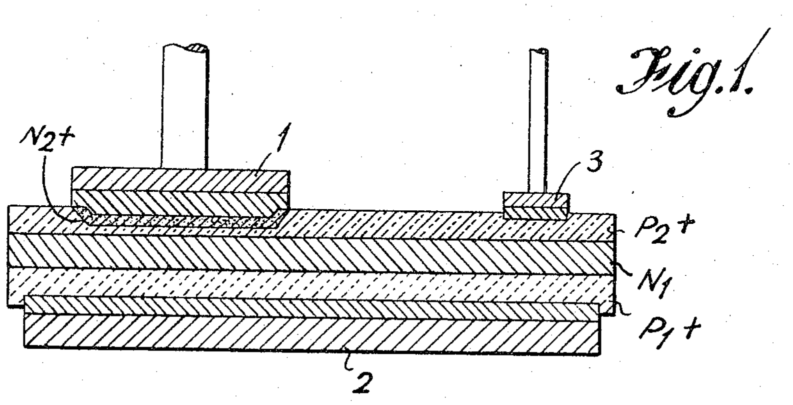

The present invention relates to semiconductor devices.

The invention is particularly applicable to silicon controlled rectifiers and to four-layer two-terminal switching diodes. These are generally formed from a body of silicon in the form of a wafer having a surface layer of P-type conductivity adjacent one face and a surface layer of N-type conductivity adjacent the opposite face of the wafer, together with contiguous central layers of N-type conductivity and P-type conductivity, the N-type central layer being contiguous to the P-type surface layer and the P-type central layer being contiguous to the N-type surface layer.

In a four-layer two terminal diode, two electrodes respectively are secured to, and make ohmic contact with, the two surface layers; these electrodes constitute the anode terminal and the cathode terminal of the diode.

In a three terminal controlled rectifier, a further electrode is secured to, and makes ohmic connection with, the central P-type layer; this electrode constitutes the trigger terminal through which current may be passed into the controlled rectifier, to initiate the flow of forward current through the device.

In the case of a three terminal controlled rectifier, no flow of forward current occurs until the trigger current produced by a positive bias of the trigger terminal with respect to the cathode exceeds a limiting value; when this limiting value is exceeded the part of the rectifier between the cathode and the anode behaves as a conventional P-N junction rectifier in the forward low impedance condition. In the absence of trigger current the part of the rectifier between the cathode and the anode displays a high impedance characteristic when biased in either conducting directions, the characteristic of the controlled rectifier being similar to that of a conventional P-N junction rectifier when biased in the reverse conducting direction. A four-layer two terminal switching diode and a three terminal controlled rectifier will thus correspondingly break-over into a low impedance condition when the peak reverse voltage between the cathode and the anode exceeds a limiting value.

The structure of semi-conductor devices is usually described with a notation in which layers of semi-conductor material of N-type and P-type conductivity are referred to by the symbols N and P respectively, those layers having a high electrical conductivity being further denoted by the supplementary index +. This conversion is adopted in the following description.

Semiconductor controlled rectifiers and four-layer two terminal diodes have hitherto been formed from a wafer of semiconductor material having a $P_1+$, $N_1$, $P_2+$, $N_2+$ structure; the value of break-down voltage of such devices can depend upon the geometry of the wafer. Thus under bias conditions with layer $P_1+$ positive, the $N_1P_2+$ junction is reversely biased. An increase in the applied voltage can cause the space charge region of this junction to expand and "punch through" to the $P_1+N_1$ junction. This punched through condition sets a limit to the voltage which the device can stand before breakdown occurs.

An object of the present invention is the provision of an improved semiconductor device the break-down voltage of which is relatively high.

In accordance with the present invention a semiconductor device includes a body of semiconductor material containing three sequentially arranged junctions between four regions of material respectively of the conductivity types P,N,P,N, wherein at least one of the central N or P regions includes two sub-regions of the same conductivity type but of different conductivities, the sub-regions being sequentially arranged in such a sense that the tendency for the space charge region associated with the central junction to expand, as a progressively increased bias is applied to the device, to one of the neighbour junctions and so cause breakdown of the device, is reduced.

Figure 2:
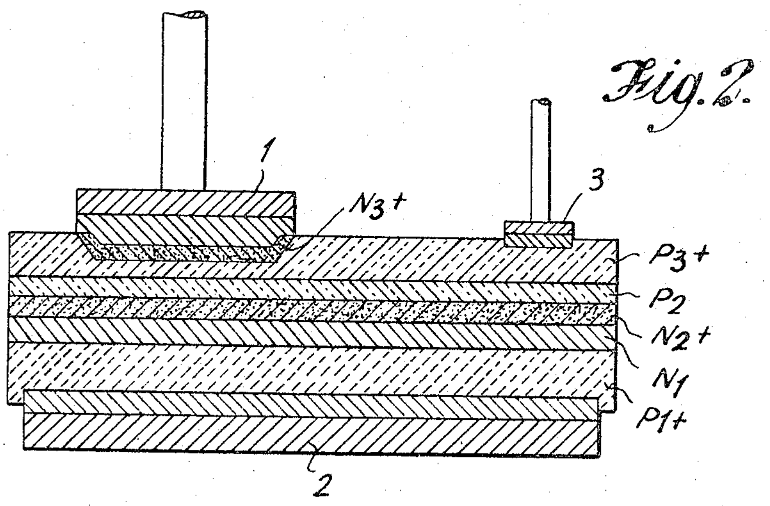

The invention will now be described, by way of example, with reference to the accompanying drawings, in which:

FIGURE 1 is a sectional side elevation of a conventional three terminal silicon controlled rectifier; and FIGURE 2 is a sectional side elevation of a three terminal silicon controlled rectifier according to the invention.

Referring first to FIGURE 1, a conventional three terminal silicon controlled rectifier is shown formed from a wafer of silicon having a surface layer $P_1+$ of P-type conductivity at one face and a surface layer $N_2+$ of N-type conductivity at the opposite face. A central layer $P_2+$ of P-type conductivity and a central layer $N_1$ of N-type conductivity are contiguous respectively with the surface layer $P_1+$ and the surface layer $N_2+$, and are contiguous to one another. Electrodes 1 and 2 constituted of molybdenum are secured to, and form ohmic connection with, the surface layer $N_2+$ and the surface layer $P_1+$ respectively, and constitute the cathode terminal 1 and the anode terminal 2 respectively of the controlled rectifier. A further electrode 3 also constituted of molybdenum is secured to, and forms ohmic connection with, the central layer $P_2+$ and constitutes the trigger terminal of the controlled rectifier.

Referring now to FIGURE 2, a silicon controlled rectifier according to the invention is shown formed from a substantially monocrystalline silicon wafer having a layer $P_1+$ of P-type conductivity at one face and a surface layer $N_3+$ of N-type conductivity at the opposite face of the wafer. An outer sub-layer $N_1$ of N-type conductivity and an outer sub-layer $P_3+$ of P-type conductivity are contiguous respectively with the surface layer $P_1+$ and the surface layer $N_3+$. Two contiguous inner sub-layers $N_2+$ and $P_2$ of N-conductivity and P-conductivity respectively are located between the outer sub-layers, the inner sub-layer $P_2$ being contiguous with the outer sub-layer $P_3+$ and the inner sub-layer $N_2+$ being contiguous with the outer-sub-$N_1$ layer.

The conductivity of the layer $N_2+$ is higher than that of the adjacent layer $N_1$. Electrodes 2 and 3 constituted of molybdenum are secured to, and form ohmic connection with, the layer $P_1+$ and the exposed surface of the layer $P_3+$ and constitute the anode terminal and trigger terminal of the controlled rectifier. A further molybdenum electrode 1 is secured to, and forms ohmic connection with, the layer $N_3+$ and constitutes the cathode terminal.

A suitable method for producing the wafer shown in FIGURE 2 consists of suitably locating a suitable foundation in the form of a thin slice of silicon of 100 ohm-centimeter P-type conductivity with one face resting upon, and masked by, a quartz pedestal, the opposite face of the slice being exposed. The slice constitutes the layer $P_2$ of the wafer and upon it the layers $N_2+$ and $N_1$ are epitaxially and successively deposited.

In order to successively deposit the layers $N_2+$ and $N_1$, the slice is located within the central portion of a quartz tube located within an electrically heated furnace. With the slice and the pedestal maintained at a temperature within the range 1150° C. to 1250° C., silicon tetrachloride, in vapour phase, and phosphorus pentoxide, also in vapour phase, are passed from a suitable source through the quartz tube and into contact with the exposed face of the slice. Decomposition of the silicon tetrachloride occurs at the heated surface of the slice and results in the deposition therefrom of a phosphorus doped N-type layer of silicon; the layer initially deposited is the layer $N_2^+$. The deposition of silicon onto the wafer is continued until the deposited layer $N_2^+$ has reached the desired thickness; the concentration of the phosphorus during the deposition is adjusted to impart the desired conductivity to the layer $N_2^+$. In order to produce the layer $N_1$ the deposition of silicon is continued, but the concentration of the phosphorus is reduced.

The wafer so produced comprises the layers $P_2$, $N_2^+$ and $N_1$ and is sealed into a quartz tube containing argon together with a gallium impurity activator. The tube is inserted into a suitable furnace and heated at a temperature within the range 1200° C. to 1300° C. for a time sufficient to allow the gallium to diffuse to the desired depth into both of the opposite surfaces of the wafer so as to produce the layer $P_3^+$ and the layer $P_1^+$, within outer parts of the original layer $P_2$ and the epitaxially deposited layer $N_1$ respectively. A suitable time is of the order of 3 days.

After removal of the wafer from the quartz tube, a suitable pellet of a gold antimony alloy is placed into contact with a selected area of the exposed surface of the layer $P_3^+$ and the wafer is heated to a temperature of about 700° C. in order to cause the gold antimony to alloy into the surface of the layer $P_3^+$ and produce the layer $N_3^+$.

The molybdenum cathode terminal 1 of the controlled rectifier is directly soldered to the gold antimony forming the layer $N_3^+$. The molybdenum anode terminal 2 and trigger terminal 3 are subsequently soldered respectively to a further selected portion of the exposed surface of the layer $P_3^+$ and to the layer $P_1^+$ by a similar alloying operation using aluminum as the solder.

As an alternative to the method described above, all the layers of N-type and P-type conductivity constituting the wafer from which the controlled rectifier is formed, may be produced by epitaxial deposition of silicon. In this case, after the formation of the $N_1$, $N_2^+$, $P_2$ structure as hereinbefore described, the wafer is placed into a further tube and is similarly heated with the faces in contact with silicon tetrachloride and a boron impurity activator in vapour phase the boron being in a concentration which ensures that the layers $P_1^+$ and $P_3^+$ deposited over the layers $P_2$ and $N_1$ are of the desired conductivity.

The wafer and the electrodes secured thereby, may be enclosed in a suitable housing or otherwise encapsulated.

What we claim is:

A semiconductor device comprising: a body of semiconductor material; a first face to that body; a second face to that body on the opposite side to the first face; a first surface region of that body of P-type conductivity and adjacent the first face; a second surface region of that body of N-type conductivity and adjacent the second face; a first central region of that body of N-type conductivity and adjacent the first surface region; a second central region of that body of P-type conductivity and adjacent the second surface région; a first sub-region of N-type conductivity of the first central region, extending contiguous to the first surface region but spaced from the second central region; a second sub-region of the first central region, also of N-type conductivity but of greater conductivity than the first sub-region and the second central region but spaced from the first surface region; a third sub-region of P-type conductivity of the second central region, extending contiguous to the second sub-region but spaced from the second surface region; a fourth sub-region of the second central region, also of P-type conductivity but of greater conductivity than the third sub-region, extending contiguous to both the third sub-region and the second surface region but spaced from the first central region; a first PN junction between the first surface region and the first sub-region; a second PN junction between the second sub-region and the third sub-region; a third PN junction between the fourth sub-region and the second surface region; a first electrode secured to and forming ohmic connection with the first surface region; and a second electrode secured to and forming ohmic connection with the second surface region; whereby, in use, the tendency for the space charge region of the second PN junction to expand to one of the other PN junctions and cause breakdown of the device when a bias voltage is applied to the device, is reduced.

References Cited

UNITED STATES PATENTS

| | | | |
|---|---|---|---|
| 3,211,971 | 10/1965 | Barson et al. | 317—235 |
| 3,226,614 | 12/1965 | Haenichen | 317—234 |
| 3,249,831 | 5/1966 | New et al. | 317—235 |

JAMES D. KALLAM, *Primary Examiner.*

JOHN W. HUCKERT, *Examiner.*

R. SANDLER, *Assistant Examiner.*